(12) United States Patent
Van Arendonk

(10) Patent No.: US 7,351,951 B2
(45) Date of Patent: Apr. 1, 2008

(54) OPTOELECTRONIC SEMICONDUCTOR DEVICE AND METHOD OF MANUFACTURING SUCH A DEVICE

(75) Inventor: Anton Petrus Maria Van Arendonk, Eindhoven (NL)

(73) Assignee: Koninklijke Philips Electronics N.V., Eidnhoven (NL)

( * ) Notice: Subject to any disclaimer, the term of this patent is extended or adjusted under 35 U.S.C. 154(b) by 308 days.

(21) Appl. No.: 10/526,867

(22) PCT Filed: Aug. 11, 2003

(86) PCT No.: PCT/IB03/03645

§ 371 (c)(1),
(2), (4) Date: Mar. 4, 2005

(87) PCT Pub. No.: WO2004/023564

PCT Pub. Date: Mar. 18, 2004

(65) Prior Publication Data

US 2005/0258350 A1  Nov. 24, 2005

(30) Foreign Application Priority Data

Sep. 9, 2002 (EP) .................................. 02078668

(51) Int. Cl.
*H01J 5/02* (2006.01)
*H01L 31/0232* (2006.01)

(52) U.S. Cl. ........................ 250/239; 257/432
(58) Field of Classification Search ................ 250/239; 257/432

See application file for complete search history.

(56) References Cited

U.S. PATENT DOCUMENTS 5,302,778 A  4/1994  Maurinus
5,925,898 A  7/1999  Spath
5,981,945 A  11/1999  Spath et al.
6,037,641 A  3/2000  Goel (Continued)

FOREIGN PATENT DOCUMENTS

EP  0242663 A2  10/1987

(Continued)

*Primary Examiner*—Kevin Pyo
*Assistant Examiner*—Kevin Wyatt
(74) *Attorney, Agent, or Firm*—Paul Im

(57) ABSTRACT

The invention relates to a semiconductor device (10) comprising a semiconductor element (1), particularly a solid-state image sensor (1), comprising a semiconductor body (11) of which one surface comprises an optically active part (1A) and an optically inactive part (1B) within which electrical connection regions (2) of the optoelectronic semiconductor element (1) are present, while a body (3) is present above the optically active area (1A) of the surface of the semiconductor body (11) comprising an optical component (3B). According to the invention the body (3) comprises an optically transparent foil (3) which is present on the optically active part (1A) of the surface of the semiconductor body (11) and which is attached thereto with an optically transparent adhesive layer (4) and in which the optical component (3B) is formed. The device (10) is very stable, compact and easy to manufacture, that is to say in batches. For example a component (3B) such as a lens (3B) may easily be formed by pressing a suitably formed die (13) into the foil (3). A method according to the invention for manufacturing the device according to the invention is cost-effective and easy.

17 Claims, 5 Drawing Sheets

U.S. PATENT DOCUMENTS

Figure 1:
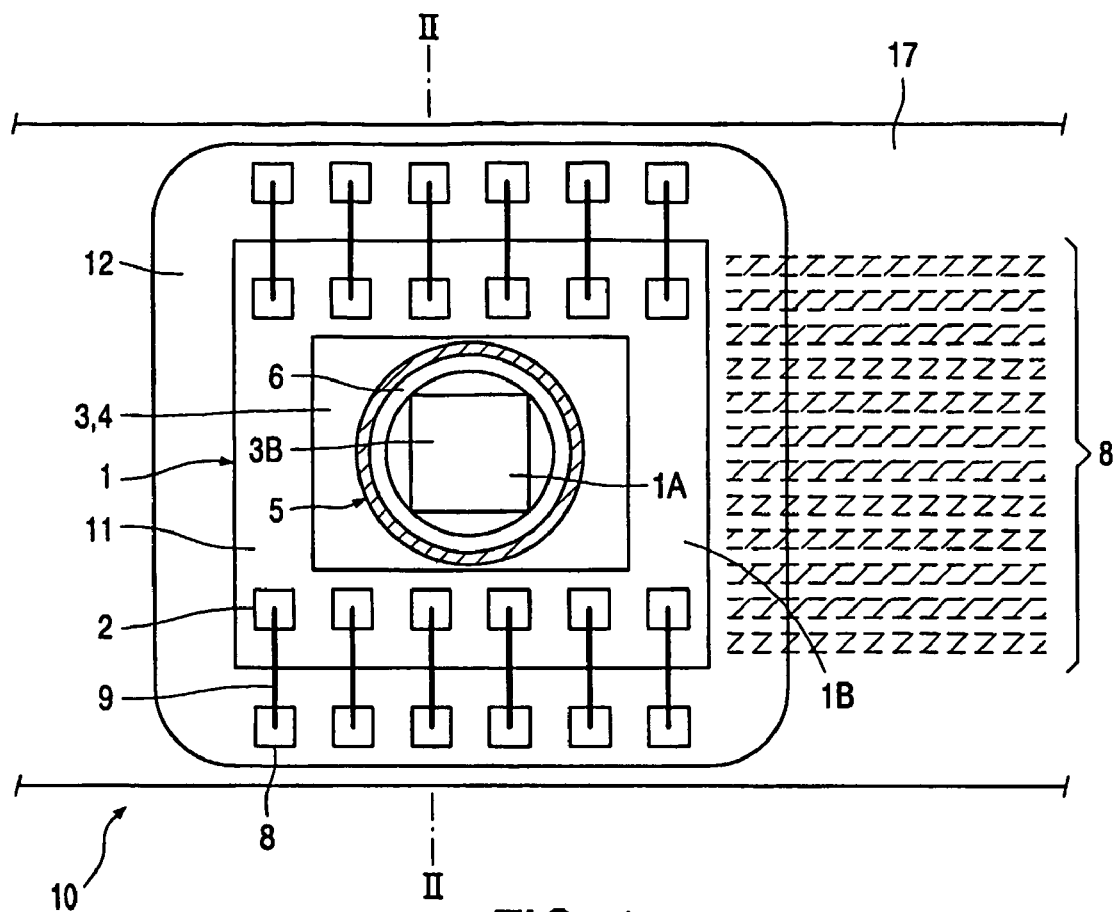

| | | |
|---|---|---|
| 6,242,274 B1 | 6/2001 | Nyholm |
| 6,624,948 B1* | 9/2003 | Miller et al. ............... 359/619 |
| 2001/0050721 A1* | 12/2001 | Miyake ..................... 348/374 |
| 2004/0065952 A1* | 4/2004 | Prior ......................... 257/724 |
| 2004/0069999 A1* | 4/2004 | Lin et al. .................... 257/88 |
| 2004/0070014 A1* | 4/2004 | Lin et al. ................... 257/289 |
| 2004/0166763 A1* | 8/2004 | Hanada et al. ............... 445/51 |
| 2004/0227845 A1* | 11/2004 | Kawai ...................... 348/360 |

FOREIGN PATENT DOCUMENTS

| | | |
|---|---|---|
| EP | 0242663 A3 | 10/1987 |
| EP | 0511404 A1 | 11/1992 |
| EP | 0511404 B1 | 11/1992 |
| EP | 0252876 B1 | 2/1993 |
| EP | 0525876 A1 | 2/1993 |
| EP | 1130905 A2 | 9/2001 |
| EP | 1130905 A3 | 12/2001 |
| JP | 2000032354 A | 1/2000 |
| WO | WO 93/22787 | 11/1993 |

* cited by examiner

OPTOELECTRONIC SEMICONDUCTOR DEVICE AND METHOD OF MANUFACTURING SUCH A DEVICE

The invention relates to a semiconductor device comprising an optoelectronic semiconductor element, more particularly, a solid-state image sensor, comprising a semiconductor body a surface of which has an optically active part and a non-optically active part in which are located electrical connection areas of the optoelectronic semiconductor element, above which optically active part of the surface of the semiconductor body a body is located comprising an optical component. If the element comprises an image sensor, such a device is applied, for example, in a camera. The invention also relates to a method of manufacturing such a device.

Such a device is known from patent document WO 93/22787, published on Nov. 11, 1993. It describes a solid-state image sensor mounted on a printed circuit board (PCB). A lens holder having a lens mounted on the PCB by means of pins is located above the sensor. The pins run through a flexible foil on which connection conductors are accommodated for the electrical connection areas of the sensor which are situated outside an optically active part of the surface of it. It is also an object of the construction to have a proper alignment of the sensor relative to the lens.

A drawback of the known device is that it is sensitive to low-temperature operation. The image sometimes fades away under these conditions. On top of this, the manufacture of the known device is relatively complicated.

It is an object of the invention to provide a device of the type defined in the opening paragraph that does not have the drawback mentioned above and that is suitable for use at lower temperatures and is also simple to manufacture.

For this purpose, a device of the type mentioned in the opening paragraph is characterized according to the invention in that the body comprises an optically transparent foil in which the component is formed that is located on the optically active part of the surface of the semiconductor body and is connected to it. The invention is first and foremost based on the recognition that the fading of the image occurring at lower temperatures is caused by condensation of moist that permeates in the space between the element and the optical component. Condensation of moist—or other vapors caused by output gases—on the active part of the surface of the sensor is avoided by covering this with a foil. Since an optically transparent material is chosen for the foil, the sensitivity to radiation from the optoelectronic semiconductor element such as an image sensor is not affected detrimentally by this. Moisture drops present in the space above the foil and either condensing on the foil or not or also dust particles present there do not substantially have any influence on the optical quality of the image because they are not located in the focus. Since condensation and/or precipitation of moist or impurities on the surface of the sensor is avoided, also the lifetime of the sensor may be extended. Further an important advantage of a device according to the invention is that this device can have an up to 10% larger radiosensitivity because the number of surfaces on which reflection losses may occur is reduced.

The invention is further based on the recognition that an optical component such as a lens can easily be formed in such a foil, for example, by pressing on it with a (heated) die. This may be effected after the foil has been glued onto the element. Then, when the optical component is being aligned relative to the optically active part of the surface, alignment features normally already available in the semiconductor element anyway can be made use of. Also the application of the optical foil and the formation of the component therein can take place when the semiconductor element is still in the so-called glue phase. All in all the manufacture of the device according to the invention can be extremely simple as a result of these factors.

In a preferred embodiment of a semiconductor device according to the invention the foil is connected via an optically transparent adhesive layer to the surface of the semiconductor body. An advantage of the use of an optically transparent adhesive layer is that such an adhesive layer can be applied in a simple manner during the production process, provides proper adhesion without the advantageous effect of the foil being canceled in whole or in part.

In a further preferred embodiment of a semiconductor device according to the invention a further body is attached to the semiconductor body, which further body comprises a further optical component above the active part of the surface of the semiconductor body, which further optical component is separated from the foil by means of a hollow space. In this way the element can for example be protected from the annoying influence of infrared radiation (IR) by choosing a filter for the further optical component, which filter does not allow the IR radiation to pass. The component may sometimes also advantageously comprise a further lens. The further body comprises, for example, a cylindrical part one end of which is glued to the foil and the other end of which is provided with the further optical component.

The semiconductor element is preferably mounted on an electrically insulating flexible foil one side of which has a conductor pattern, the electrical connection areas are connected to the conductor pattern by means of wire links and the wire links are enveloped in an insulating sheathing. The sheathing-just like the further body—is preferably opaque. This means that, for example, visible light either reflects from it or is absorbed by it.

A method of manufacturing a semiconductor device comprising an optoelectronic semiconductor element with a semiconductor body a surface of which has an optically active part and an optically non-active part within which there are electrical connection areas of the optoelectronic semiconductor element, above which optically active part of the surface of the semiconductor body a body is provided having an optical component, characterized according to the invention in that for the body an optically transparent foil is chosen in which the foil is formed that is provided on the optically active part of the surface of the semiconductor body.

In a preferred embodiment of the semiconductor device according to the invention the foil is connected by an optically transparent adhesive layer to the surface of the semiconductor body. One advantage of the use of an optically transparent adhesive layer is that such a layer is simple to apply during the manufacturing process and provides proper adhesion without the advantageous effect of the foil being canceled in whole or in part.

In a further preferred embodiment the optical component is formed in the foil by pressing on the foil with a profiled die. This preferably takes place when the device is still in the so-called glue phase.

In an advantageous variant a further body is attached to the semiconductor body, which further body is provided with a further optical component so that the further optical component is located above the optically transparent foil and is separated from it by a hollow space. For the further body is preferably chosen a cylindrical part one end of which is glued to the foil and the other end of which is provided with the further optical component. The semiconductor element is preferably applied to an electrically insulating flexible foil one side of which has a conductor pattern, the electrical connection areas are connected to the conductor pattern by means of wire links and the wire links are enveloped in an insulating sheathing.

In a highly advantageous embodiment a carrier body with a number of strip-like or rectangular optically transparent foils which receive the adhesive layer on the side turned away from the carrier body is moved above a wafer that contains a number of semiconductor elements and, after the carrier body with the foils has been aligned relative to the wafer of semiconductor elements, the foils are glued to the semiconductor elements by pressing the carrier body onto the wafer after which the carrier body is removed.

Once the wafer has been provided with the optically transparent foils and once the optical component has been formed therein, preferably a further body that is provided with a further optical component is attached to each of the semiconductor elements in the wafer so that the further component is located above the active part of the surface of the semiconductor element and is separated from the foil by a hollow space. The wafer is preferably fastened to a membrane with a side facing the surface of the semiconductor elements, which membrane is located inside a ring and which wafer is split up into separate semiconductor elements by sawing after the further optical component has been installed.

In an attractive variant the individual semiconductor elements are deposited on a strip-like electrically insulating flexible foil one side of which is provided with a conductor pattern, the electrical connections are linked to the conductor pattern by means of wire links, the wire links are enveloped in an insulating sheathing after which the strip-like flexible foil is split up into parts each one of which comprising a semiconductor element.

The optical foils are preferably manufactured by gluing an optically transparent film onto a UV transparent carrier film by means of a glue that can be detached by UV radiation, forming the strip-like or rectangular foils in the optically transparent film by locally cutting by means of a laser beam, after which the redundant parts of the film can be partly pressed out of it or completely removed. The carrier body of the foils is formed, for example, by the UV transparent carrier film. Once the redundant parts of the film have been removed and once the foils have been glued onto the wafer, the UV transparent carrier film can be removed again by means of UV radiation. The carrier body is preferably formed by a pair of plate-like vacuum tweezers by which the UV transparent carrier film comprising carrier foils is picked up, after which the UV transparent carrier film is removed via UV radiation.

It should be observed that the tolerances necessary for a proper optical operation can be produced extremely well with a method according to the invention. In this way an alignment accuracy of the optical component in the xy-direction of +/−50 μm and in the z-direction of +/−100 μm can easily be achieved. But also higher accuracies such as a tolerance from +/−5 to 10 μm can be achieved, however. The tilt accuracy, that is to say, the angular deviation of the normal relative to 90 degrees can easily be +/−0.8 degree or even less.

Figure 2:
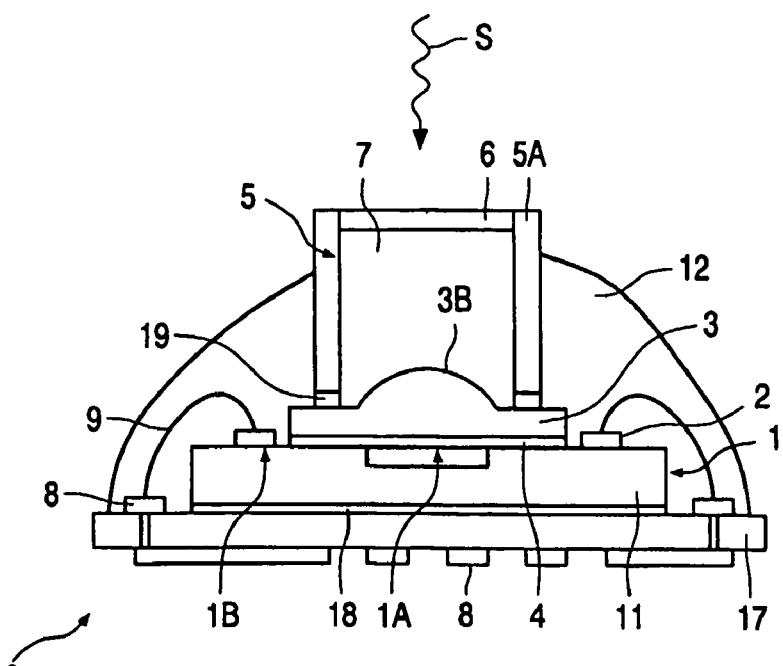
Figure 13:
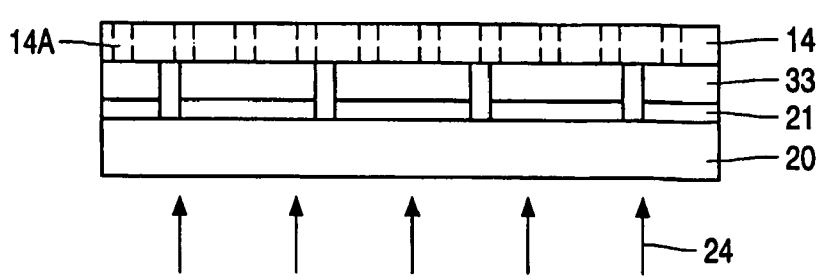
Figure 14:
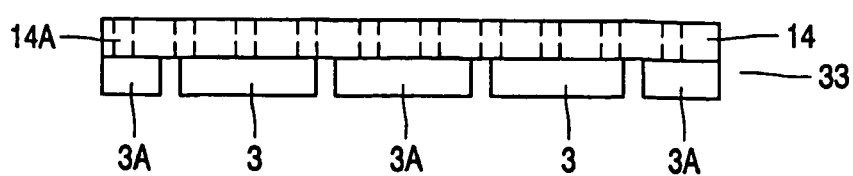
Figure 15:
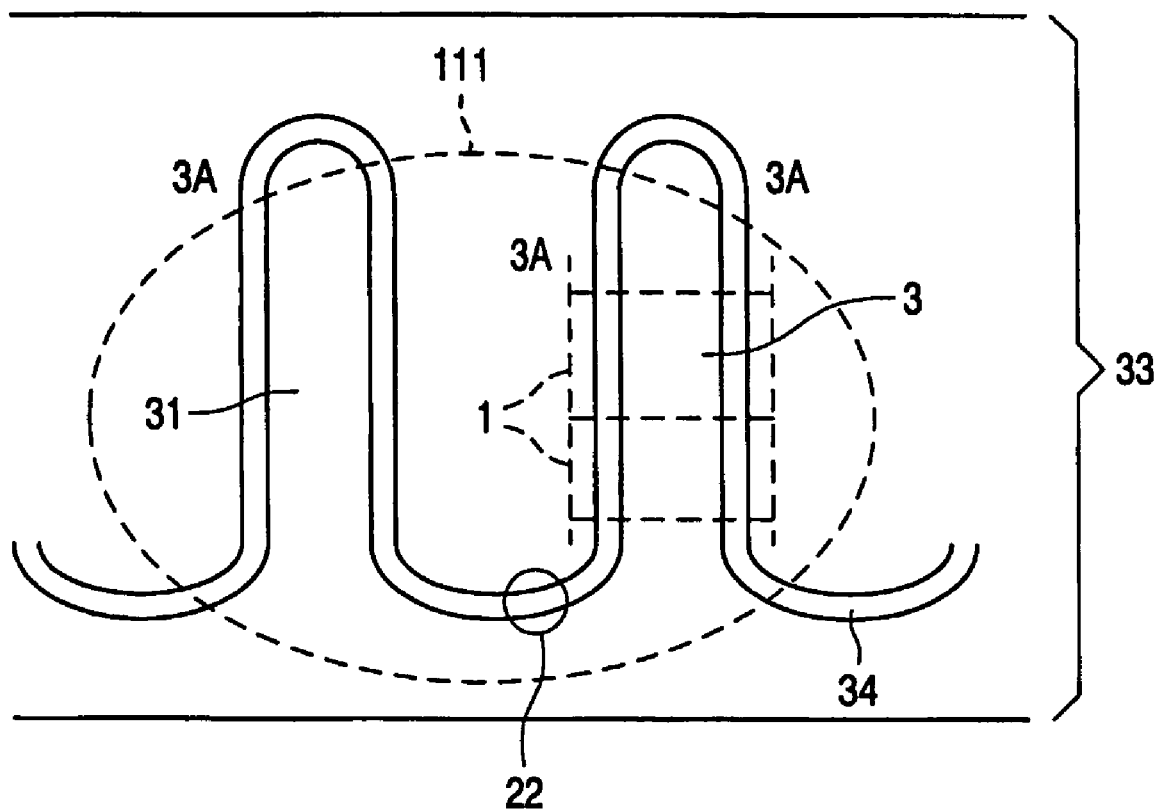

The invention will now be further described with reference to an example of embodiment and the drawing in which:

FIG. 1 shows schematically and in plan view an embodiment of a semiconductor device according to the invention, FIG. 2 shows schematically and in a cross-sectional view in the thickness direction and along the line II-II the device shown in FIG. 1, FIGS. 3 to 9 show the device of FIG. 1 in consecutive stages of manufacturing in a cross-sectional view corresponding to that of FIG. 2 by means of an embodiment of a method according to the invention, FIGS. 10 to 14 show the manufacture of the foils used in the method of FIGS. 3 to 9 in consecutive stages of this manufacture, and FIG. 15 illustrates a variant to the manufacture of FIGS. 10 to 14.

The Figures are not drawn to scale and some dimensions, such as dimensions in the thickness direction are shown exaggerated for clarity. Like areas or component parts as much as possible carry like reference characters in the various Figures.

FIG. 1 shows schematically and in plan view an embodiment of a semiconductor device according to the invention and FIG. 2 shows schematically and in a cross-sectional view in the thickness direction and along the line II-II the device shown in FIG. 1. The device 10 comprises an optoelectronic semiconductor element 1, here a CMOS (Complementary Metal Oxide Semiconductor) solid-state image sensor for cameras, comprising a semiconductor body 11 that on one surface has an optically active part 1A and a non-optically active part 1B within which there are electrical connection areas 2 of the element 1. Above the optically active part 1A of the surface of the semiconductor body 11 there is a body 3 that comprises an optical component 3. There are also so-called micro-lenses here directly on the surface of the CMOS sensor and on each pixel of it. They are not shown in the drawing.

According to the invention the body 3 comprises an optically transparent foil 3 which is located on the optically active part 1A of the surface of the semiconductor body 11 and is connected thereto by means of a adhesive layer 4 and in which the component 3B is formed. In this example the optical foil 3 comprises polyethene and is 100 μm thick. It can be delivered by for instance 3M company. The foil 3 may also be made of different materials such as polyesters and suitable thicknesses lie between for example 20 and 200 μm. The lateral dimensions are adapted to the dimensions of the optically active part 1A of the element 1 and are in this example 2 mm×1.5 mm. The active part 1A is here about 1.6 mm×1.2 mm, while the whole element measures 1.4 mm×4 mm. The adhesive layer 4 here comprises a so-called PSA (pressure Sensitive Adhesive) also obtainable from 3M by the name of 3M Optical Clear Adhesives, however other suitable adhesives may be used as well. The lens 3B has lateral dimensions that substantially correspond to the dimensions of the active area 1A. The opening of the lens 3B and the focal distance are found for example between 1 and 3 mm.

In this example the device 10 comprises a further body 5 which is fixed to the semiconductor body 11 in this case to the foil 3 and which, above the active part 1A of the surface of the semiconductor body 11, comprises a further component 6 in this case an IR filter which is separated from the foil 3 by a cavity or hollow space. The further body 5 has a cylindrical part 5A of which one end is glued onto the foil 3 by an adhesive layer 19 which is here again a PSA glue. The other end allows the radiation S to be detected, i.e. visible light, to be incident on the element 1 and has the further optical component 6, in this case the IR filter 6. Advantageously like in this case, the semiconductor element 1 is fixed onto an electrically insulating flexible foil 17, one side of which has a conductor pattern 8. The electrical connection areas 2 are connected by wire links 9 to the conductor pattern 8, here by vias in the foil 17, and the wire links are enveloped in an insulating sheathing 12 which in this case comprises a so-called glob-top or black encapsulation on epoxy or polyurethane base and is non-transparent to visible light. The sheathing 12 here too protects a large part of the further body 5 from light incident from the side. The device 10 of this example is made as follows with a method according to the invention.

FIGS. 3 to 9 show the device 10 as shown in FIG. 1 in consecutive stages of manufacturing in a cross-sectional view corresponding to that of FIG. 2 by means of an embodiment of a method according to the invention. A wafer 111 is started from (FIG. 3) which comprises a large number of semiconductor elements 1,1' as they are manufactured in customary manner and of which only two 1,1' are represented for simplicity and which comprise optically active areas 1A. A carrier body 14 is moved above it, here a pair of plate-like vacuum tweezers 14 which are connected to a vacuum arrangement—not shown in the drawing—via channels 14A. Against this vacuum arrangement there are the optically transparent foils 3 which are provided with the adhesive layer 4. The foils are aligned relative to the active areas 1A of the wafer 111. The alignment features present on the wafer 111 can then be made use of.

The optical foils 3 are now (see FIG. 4) aligned by the tweezers 14 and pressed onto the wafer 111 and glued to it by the adhesive effect. The vacuum of the tweezers 14 is turned off after which the tweezers 14 are removed. Then (see FIG. 5), with the aid of a—preferably heated—die 13 the lenses 3B are formed in the foil 3 by pressing on the foils 3 with the die 13. This may be effected simultaneously by utilizing a larger number of dies 13 or by translating a single die 13—as in this example—or a small matrix of dies 13 above the surface of the wafer 111.

Then (see FIG. 6) the wafer 111 is installed on a membrane 15 which is located inside a ring 16. This may be effected by placing the wafer 111 upside down on an auxiliary ring—not shown in the drawing—after which the ring 16 is placed around the wafer 111. The membrane 15 is then bonded by a roller to the back of the wafer 111 and the back of the ring 16. Subsequently the further bodies 5 (see FIG. 7) with the lattice 6 are fixed to the foils by bonding with the adhesive layer 19. This step too can be carried out completely or partly sequentially or in parallel.

Then (see FIG. 8) individual semiconductor bodies 11 can be formed with elements 1,1' from the wafer 111 by sawing through the latter in two mutually perpendicular directions with a sawing machine not shown in the drawing. Finally (see FIG. 9), individual semiconductor elements are picked up from the membrane 15 for example by a tubular pair of vacuum tweezers not shown in the drawing and fixed to an insulating flexible foil 17 having a conductor pattern 8 by means of an adhesive layer 18 which here comprises a glue customary per se—either conductive or not—such as an epotek (like) glue. Wire links 9 and an insulating sheathing 12 are subsequently installed and the foil 17 is cut into pieces which each contain an element 1, resulting in the device 10 shown in FIGS. 1 and 2, which device is ready for use.

Figure 3:
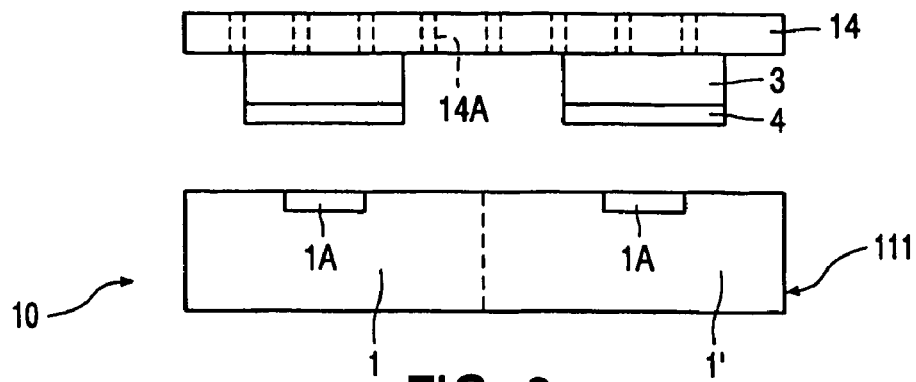
Figure 4:
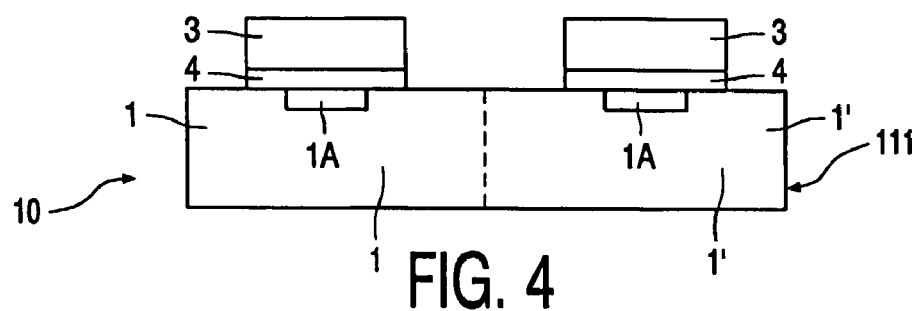
Figure 5:
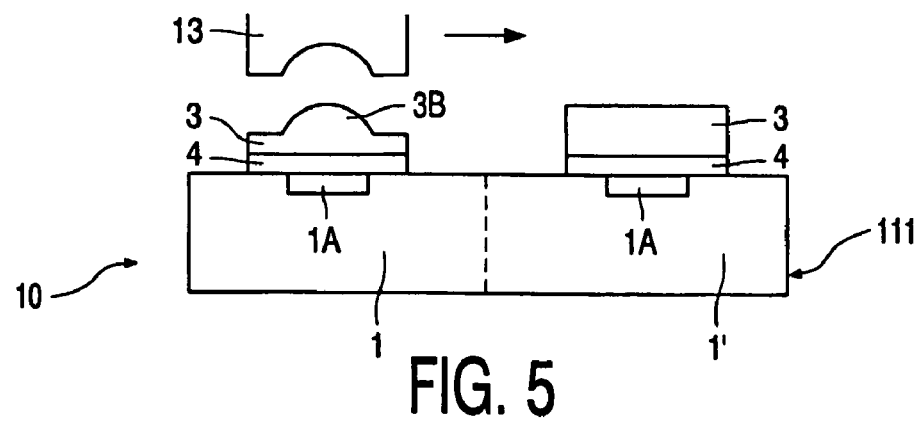
Figure 6:
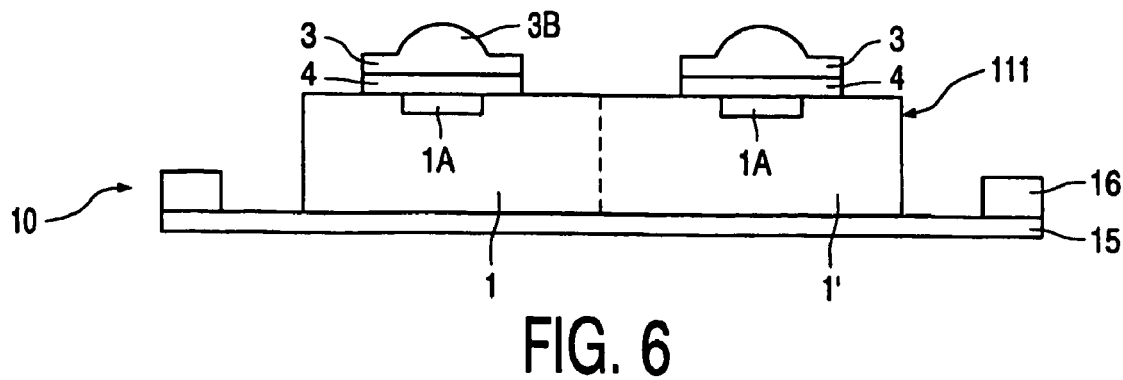
Figure 7:
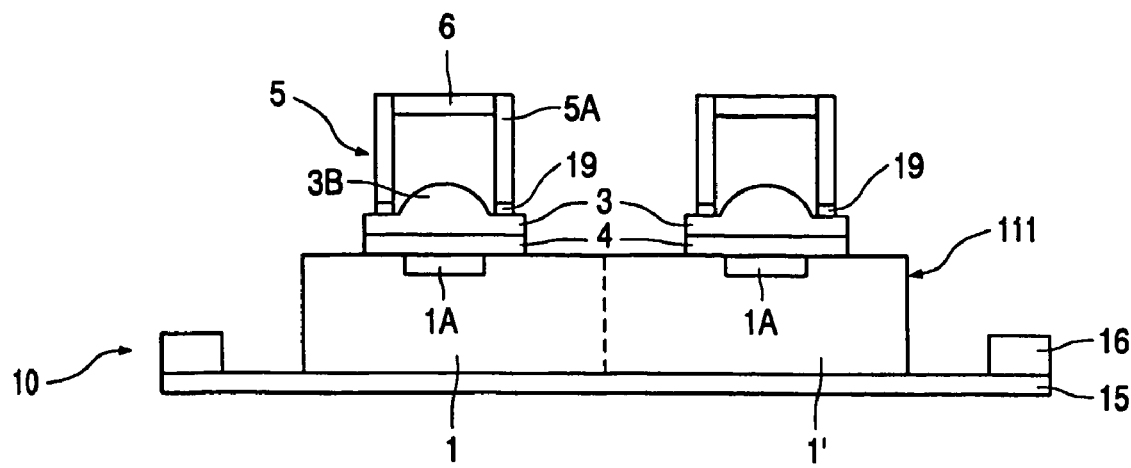
Figure 12:
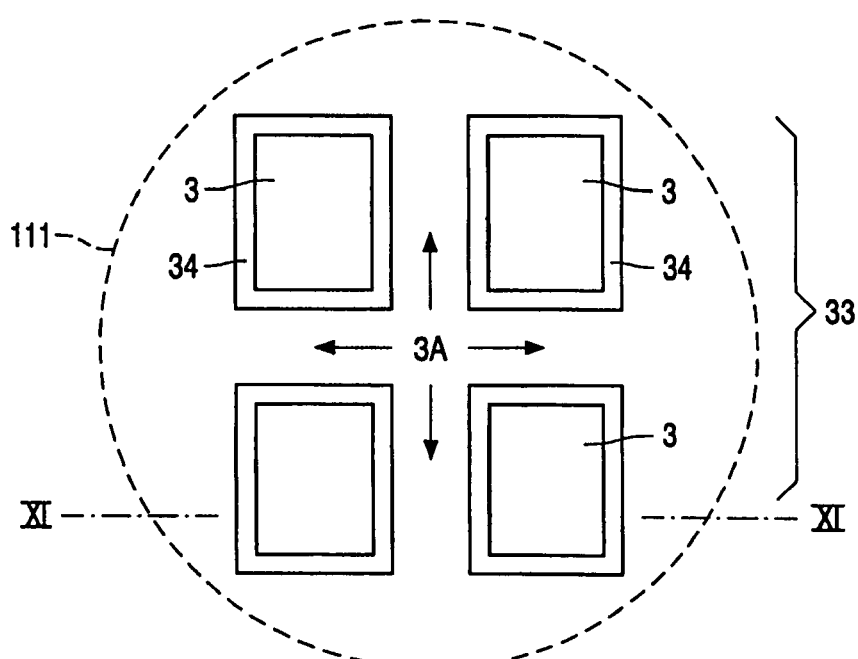

FIGS. 10 to 14 show the manufacturing of the foils used during the method of FIGS. 3 to 9 in consecutive stages of this manufacturing and—with the exception of FIG. 12 which shows a plan view—in a cross-sectional view perpendicular to the thickness direction. A carrier film that is transparent to UV radiation and has a thickness of about 100 μm is started from (see FIG. 10). On top of it there is an optically transparent film 33 of the material that is used for the foils 3. The film 33 is stuck to the carrier film by an adhesive layer 21 comprising a glue that can be made soluble by means of UV radiation. The film 33 is cut through by means of a laser beam 22, during which operation the foils 3 are formed and separated from the rest 3A of the film 33 by grooves 34. The wavelength of the laser beam 22 is selected such that it is absorbed in the film 33 indeed, but hardly or not at all in the carrier film 20 or the adhesive layer 21. Cutting through the film 33 is represented in FIG. 12 in plan view and in FIG. 11 in a cross-sectional view along the line XI-XI in FIG. 12.2 which corresponds to a plan view. FIG. 12 shows in a dotted line for clarity the (future) position of the semiconductor wafer 111. The redundant parts 3A of the film 33 can now be torn off the film 20. The film 20 can function as a carrier body 14 in FIG. 3 for providing the foils 3 on the wafer 111 after the foils 3—as is shown in FIG. 3—have been provided with an adhesive layer 4. After the foils 3 have been deposited on the wafer 111, the film 20 is removed after a UV radiation of the adhesive layer 21 through the film 20.

In this example the (substrate) film which is provided with the patterned film 33 is picked up by vacuum tweezers 14 (see FIG. 13). The adhesive layer 21 is now made soluble by means of a UV radiation 24 through the film 20, after which the adhesive layer 21 and the film 20 are removed by means of a suitable solvent. Then the carrier body 14 as shown in FIG. 14 is obtained. Once the redundant parts 3A of the film 33 have been removed and once the adhesive layer 4 has been applied by means of dipping, the situation as shown in FIG. 3 is obtained. In a variant to this the surface of the vacuum tweezers 14 is executed with a profile, while the parts of the tweezers 14 where the redundant parts 3A of the film 33 are located are flush-mounted with the carrier plate 14. The result of this is that the redundant parts 3A need not be removed as they are partly pressed into the flush-mounted parts of the carrier plate 14.

Figure 8:
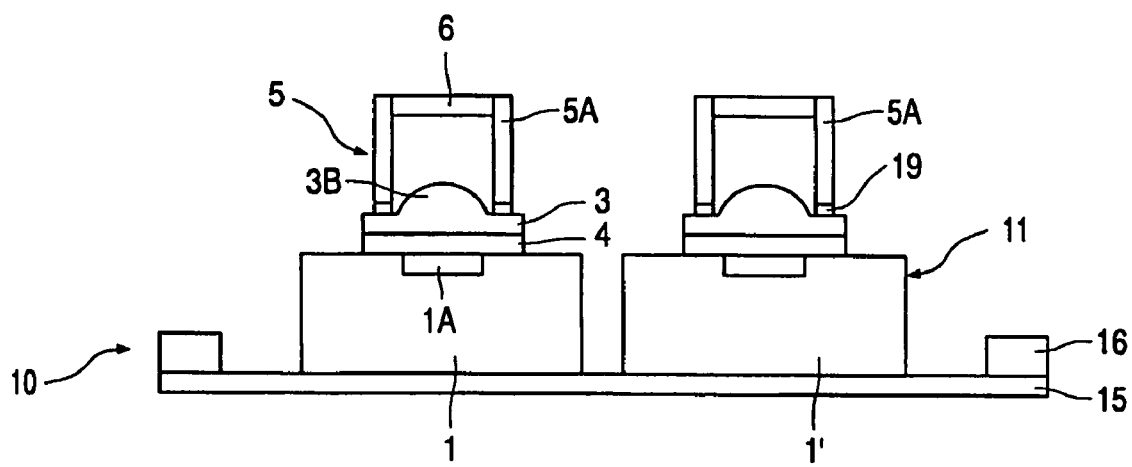
Figure 9:
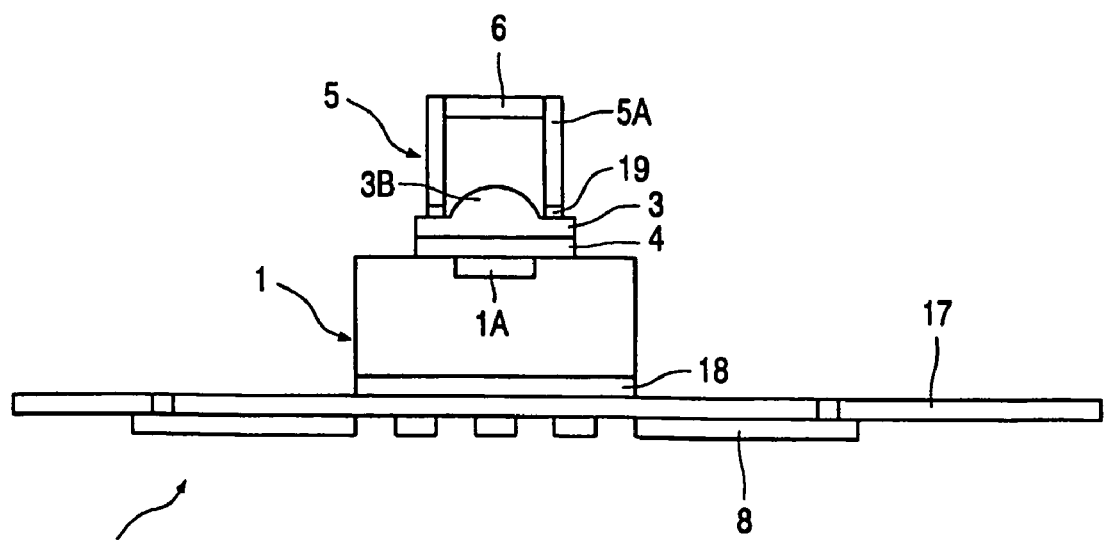
Figure 10:
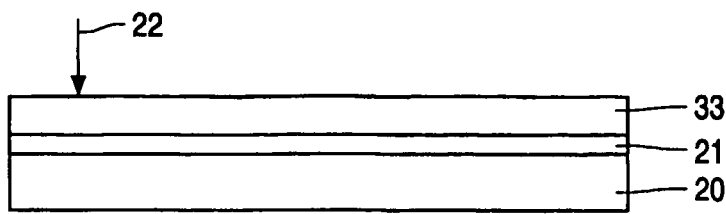
Figure 11:
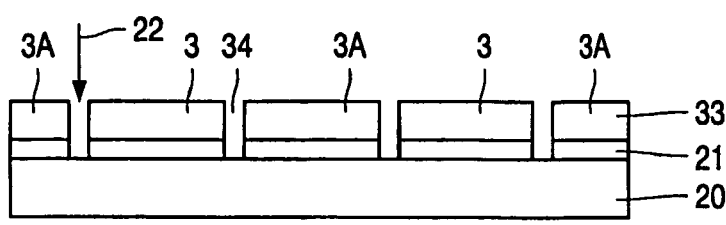

FIG. 15 illustrates a variant of the manufacturing of FIGS. 10 to 14. In a plan view—just like FIG. 12—the Figure shows a variant of the distribution of the film 33 in the foils 3 and the redundant parts 3A. The groove 34 corresponds to the path followed by the laser beam 22. The laser beam 22 can then follow an uninterrupted path. The redundant parts 3A can easily be removed because they are executed coherently. The strips then have a length that substantially corresponds to the diameter of the wafer 111, so that a strip 3 extends over a large number of elements 1 in the wafer 111. The strip 3 is placed in its longitudinal direction corresponding to the longitudinal direction of the strip-like foil 17 in FIG. 1 onto the elements 1. This variant is pre-eminently suitable if the element 1 has only two rows of electrical connection areas 2 facing each other. Both the wafer 111 and the elements 1 therein are shown by dotted lines in this Figure for clarity's sake. During the sawing of the wafer 111, as is shown in FIG. 8, the strip-like foil 3 is then sawn through in the plane of the drawing.

The invention is not restricted to the example of embodiment shown, since many variations and modifications are possible for a man of ordinary skill in the art within the scope of the invention. For example, devices may be manufactured having different geometry and/or different dimensions. In lieu of a convex lens also a concave lens may be chosen for the optical element. Even within the scope of manufacturing it is possible to have many variations. That which has been stated above with respect to the device holds for its manufacture as well. For example, in lieu of cutting by a laser beam it is also possible to use sawing for the formation of the foils. Also the optically transparent foil can, for example by means of ultrasound or laser welding techniques, be fixed to the surface of the semiconductor body.

It is further observed that the device may comprise further active and passive semiconductor elements or electronic components such as diodes and/or transistors and resistors and/or capacitances, either or not in the form of an integrated circuit. Additional circuits may then be formed to advantage which perform functions such as a timer, pulse generator, DA (Digital-to-Analog) converter or image processing means DSP (Digital Signal Processing). Finally it is observed that the device is also suitable for use with other optoelectronic components than an image sensor, such as a photodiode or LED or even optically programmable or deprogrammable ROMs (Read Only Memories).

The invention claimed is:

1. A semiconductor device comprising an optoelectronic semiconductor element comprising a semiconductor body, a surface of which has an optically active part and a non-optically active part, said non-optically active part comprising electrical connection areas of the optoelectronic semiconductor element, above which optically active part of the surface of the semiconductor body an optical body is located comprising an optical component, wherein the optical body comprises an optically transparent foil in which the optical component is formed that is located on the optically active part of the surface of the semiconductor body and is connected to it, and wherein the foil is connected to the surface of the semiconductor body by means of an optically transparent adhesive layer.

2. A semiconductor device as claimed in claim 1, wherein a further body is attached to the semiconductor body, which further body comprises a further optical component above the active part of the surface of the semiconductor body which further optical component is separated from the foil by a hollow space.

3. A semiconductor device as claimed in claim 2, wherein the further body comprises a cylindrical part of which one end is glued to the foil and of which the other end is provided with the further optical component.

4. A semiconductor device as claimed in claim 1, wherein the optoelectronic semiconductor element is fixed to an electrically insulating flexible foil of which one side is provided with a conductor pattern, the electrical connection areas are connected to the conductor pattern by means of wire links and the wire links are enveloped in an insulating sheathing.

5. A semiconductor device as claimed in claim 1, wherein the optoelectronic semiconductor element comprises a solid-state image sensor, the component comprises a lens and the further component comprises a lens and/or a filter opaque to infrared radiation.

6. A method of manufacturing a semiconductor device comprising an optoelectronic semiconductor element with a semiconductor body of which one surface has an optically active part and an optically non-active part, said non-optically active part comprising electrical connection areas of the optoelectronic semiconductor element, above which optically active part of the surface of the semiconductor body an optical body is installed comprising an optical component, wherein the body is an optically transparent foil in which the optical component is formed that is installed on the optically active part of the surface of the semiconductor body and wherein the optical component is fixed to the surface of the semiconductor body by means of an optically transparent adhesive layer.

7. A method as claimed in claim 6, wherein optical component is formed in the foil by pressing the foil with a profiled die and preferably while at the same time heating is applied.

8. A method as claimed in claim 6, wherein a further body that is provided with a further optical component is fixed to the semiconductor body so that the further optical component is located above the optically transparent foil and is separated from it by a hollow space.

9. A method as claimed in claim 8, wherein the further body comprises a cylindrical part of which one end is glued to the foil and of which the other end is provided with the further optical component.

10. A method as claimed in claim 6, wherein the optoelectronic semiconductor element is fixed to an electrically insulating flexible foil of which one side is provided with a conductor pattern, the electrical connection areas are connected to the conductor pattern by means of wire links and the wire links are enveloped in an insulating sheathing.

11. A method as claimed in claim 6, characterized in that a carrier body comprises a number of strip-like or rectangular optically transparent foils which receive the adhesive layer on the side turned away from the carrier body is moved above a wafer that contains a number of semiconductor elements and, after the carrier body with the foils has been aligned relative to the wafer of semiconductor elements, the foils are glued to the semiconductor elements by pressing the carrier body onto the wafer after which the carrier body is removed.

12. A method as claimed in claim 11, wherein once the wafer has received the optically transparent foils and once the optical component has been formed therein, a farther body that is provided with a further optical component is attached to each of the semiconductor elements in the wafer so that the further component is located above the active part of the surface of the semiconductor element and is separated from the foil by a hollow space.

13. A method as claimed in claim 12, wherein the wafer is fixed with a side facing the surface of the semiconductor elements to a membrane that is located inside a ring and is split up into separate semiconductor elements by sawing after the further optical component has been installed.

14. A method as claimed in claim 13, wherein individual semiconductor elements are fixed to a strip-like electrically insulating flexible foil of which one side is provided with a conductor pattern, the electrical connections are linked to the conductor pattern by wire links, the wire links are enveloped in a sheathing after which the strip-like flexible foil is split up into parts each one of which comprising a semiconductor element.

15. A method as claimed in claim 11, wherein the foils are made by gluing an optically transparent film onto a UV transparent carrier film by means of a glue that can be detached by UV radiation, forming strip-like or rectangular foils in the optically transparent film by cutting by means of a laser beam, after which the redundant parts of the film can be partly pressed out of it or completely removed.

16. A method as claimed in claim 15, wherein the carrier body is formed by the UV transparent carrier film and in that this is removed by exposure to UV light after the redundant parts of the film have been removed and after the foils have been fixed to the wafer.

17. A method as claimed in claim 15, wherein the carrier body is formed by a plate-like pair of vacuum tweezers with which the UV transparent carrier film provided with foils is picked up after which the UV transparent carrier film is removed by UV exposure, subsequent to which the redundant parts of the film are torn off the carrier body.

* * * * *